United States Patent [19]
Sakamoto et al.

[11] Patent Number: 5,374,829
[45] Date of Patent: Dec. 20, 1994

[54] VACUUM CHUCK

[75] Inventors: Eiji Sakamoto, Sagamihara; Ryuichi Ebinuma, Machida; Shinichi Hara, Yokohama; Mitsuji Marumo, Sagamihara, all of Japan

[73] Assignee: Canon Kabushiki Kaisha, Tokyo, Japan

[21] Appl. No.: 231,785

[22] Filed: Apr. 25, 1994

Related U.S. Application Data

[63] Continuation of Ser. No. 160,329, Dec. 2, 1993, abandoned, which is a continuation of Ser. No. 695,464, May 3, 1991, abandoned.

[30] Foreign Application Priority Data

May 7, 1990 [JP] Japan .................. 2-115741
Apr. 24, 1991 [JP] Japan .................. 3-094377

[51] Int. Cl.$^5$ ............................. H01J 37/20
[52] U.S. Cl. ................. 250/453.11; 250/492.2; 279/3; 269/21
[58] Field of Search ............ 250/453.1, 492.2; 279/3; 269/21

[56] References Cited

U.S. PATENT DOCUMENTS

| | | | |
|---|---|---|---|
| 4,213,698 | 7/1980 | Firtion et al. | 269/21 |
| 4,357,006 | 11/1982 | Hayes | 279/3 |
| 5,324,012 | 6/1994 | Aoyama | 269/21 |

FOREIGN PATENT DOCUMENTS

| | | |
|---|---|---|
| 298564 | 1/1989 | European Pat. Off. |
| 323902 | 7/1989 | European Pat. Off. |
| 114703 | 3/1984 | Japan |
| 61-239638 | 10/1986 | Japan ............ 269/21 |

OTHER PUBLICATIONS

Patent Abstracts of Japan, vol. 9, No. 56 (Mar. 12, 1985).

*Primary Examiner*—Jack I. Berman
*Attorney, Agent, or Firm*—Fitzpatrick, Cella, Harper & Scinto

[57] ABSTRACT

A wafer holding device of the vacuum attraction type includes a structural member having a protrusion for supporting a wafer and elastic members made of a material having an elasticity modulus smaller than that of the wafer and that of the structural member. The elastic members are distributed on a wafer attraction plane of the structural member.

9 Claims, 3 Drawing Sheets

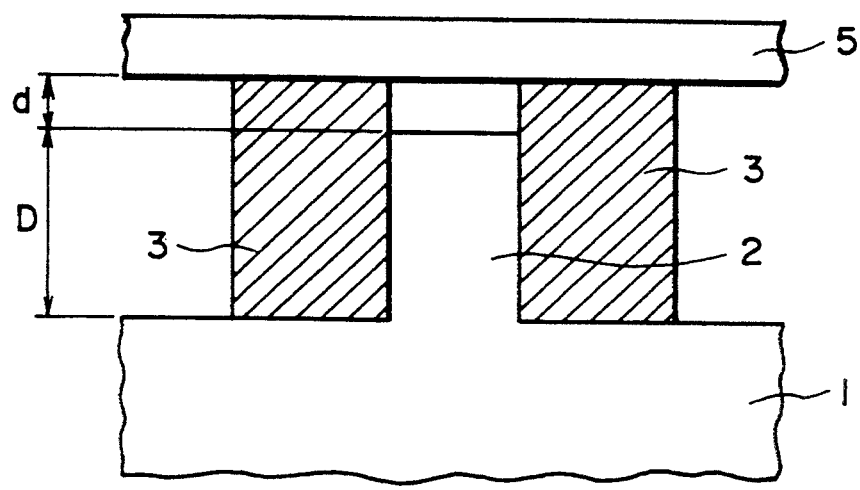
F I G. 3
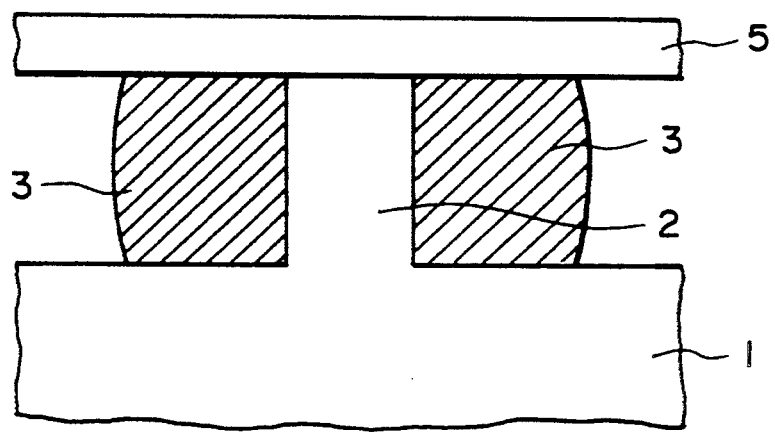
F I G. 4

VACUUM CHUCK

This application is a continuation of application Ser. No. 08/160,329, filed Dec. 2, 1993, which is a continuation of application Ser. No. 07/695,464, filed May 3, 1991, now both abandoned.

FIELD OF THE INVENTION AND RELATED ART

This invention relates to a vacuum chuck and, more particularly, to a vacuum attraction type wafer holding device usable in a semiconductor device manufacturing exposure apparatus, for holding a wafer by attracting a bottom face of the wafer through vacuum attraction.

In the field of semiconductor device manufacturing apparatuses, for transfer of a semiconductor device pattern of a mask onto a semiconductor wafer, the wafer is held by a wafer holding device. A typical example is disclosed in Japanese Published Patent Application No. 1-14703 wherein a wafer is held by attracting the bottom face thereof through vacuum attraction.

Generally, when a wafer is held by a wafer holding device and if there is a large contact heat resistance at the contact surface between the wafer and the holding device, the heat generated in the wafer by application of exposure energy, for the mask pattern transfer to the wafer, is not easily transmitted from the wafer to the holding device. This causes temperature rise in the wafer and thermal deformation of it and, thus, leads to degradation of the pattern transfer precision. Particularly, in vacuum attraction type wafer holding devices, since substantially no gas remains in the space between the wafer and the holding device except the contact surface therebetween, there occurs a considerable temperature rise in the wafer. Thus, the degradation of the pattern transfer precision is notable.

When a vacuum attraction type wafer holding device is used in a proximity type exposure apparatus wherein a mask and a wafer are placed with a small clearance of about several tens of microns, if there is a large contact heat resistance, the temperature rise in the wafer causes a temperature rise in the mask. If this occurs, thermal distortion is produced also in the mask and, therefore, the pattern transfer precision is degraded considerably.

Conventionally, a vacuum attraction type wafer holding device comprises a main structural member (table) with a wafer contact surface finished to provide a good flatness for ensuring flatness of a wafer as the same is attracted to the attracting surface. The main structural member is made of a rigid material with a large elasticity modulus for flatness correction, for correcting any warp of the attracted wafer. Thus, the contact heat resistance of such a main structural member may be small.

SUMMARY OF THE INVENTION

In this type of wafer holding device, however, even the finished wafer contact surface has small surface irregularity or waviness. Also, the bottom face of each wafer has small surface irregularity or waviness. Therefore, when the bottom face of the wafer is attracted to the wafer contact surface, the actual area of the wafer contact surface is smaller than the apparent area of the same. Thus, the contact heat resistance is not so small and it is not easy to completely prevent degradation of the pattern transfer precision.

It is accordingly a primary object of the present invention to provide a wafer holding device, particularly of the vacuum attraction type, with which the contact heat resistance can be made small.

It is another object of the present invention to provide a wafer holding device, particularly of the vacuum attraction type, with which enhanced pattern transfer precision is assured.

In accordance with an aspect of the present invention, a wafer holding device of the vacuum attraction type includes a main structural member having a wafer attraction plane in which elastic members of an elasticity modulus smaller than that of a wafer and that of the main structural member are distributed. In a preferred form, each elastic member projects beyond wafer supporting protrusions also distributed in the wafer attraction plane when no wafer is attracted thereto.

In a wafer holding device of the present invention, a wafer attracted thereto through vacuum attraction is held while being in contact with the elastic members. Since these elastic members have an elasticity modulus smaller than that of the wafer, even if the bottom face of the wafer has small surface irregularity or waviness, the contact surface of each elastic member can deform in compliance with the surface irregularity or waviness. As a result, a small contact heat resistance at the contact surface is ensured.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3 is an enlarged view showing a protrusion and an associated elastic member before a wafer is attracted thereto.

FIG. 4 is an enlarged view showing the protrusion and the elastic member of FIG. 3, after the wafer is attracted thereto.

DESCRIPTION OF THE PREFERRED EMBODIMENTS

Figure 1:
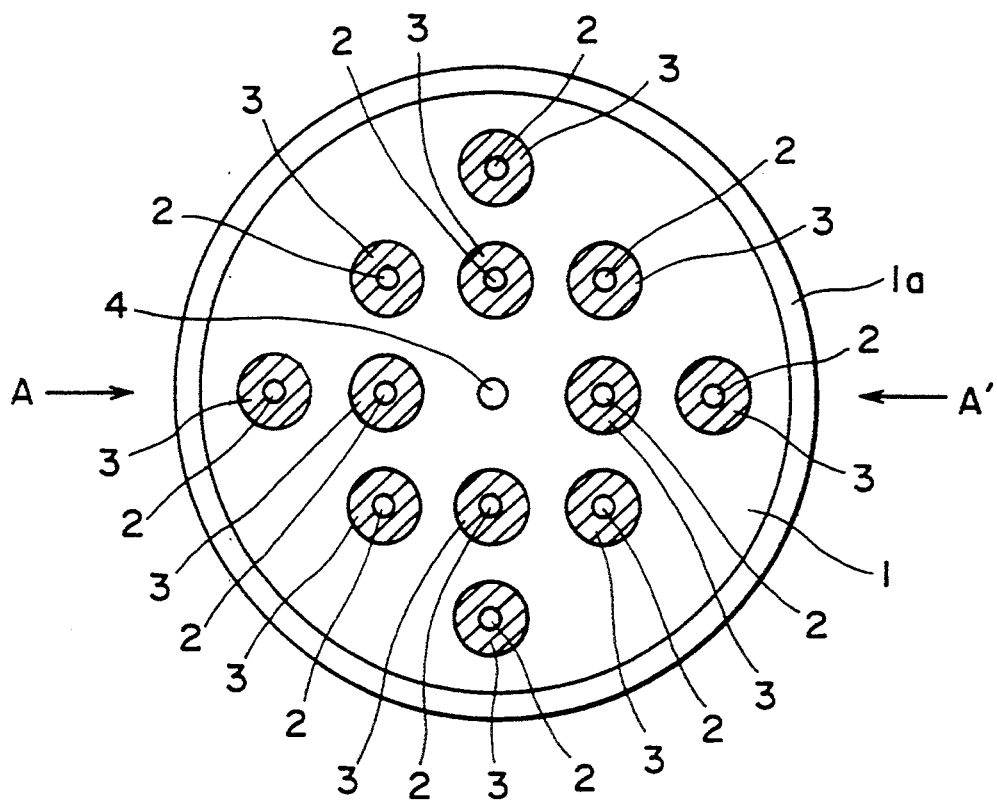
FIG. 1 is top plan view of a wafer holding device of the vacuum attraction type according to a first embodiment of the present invention.
Figure 2:
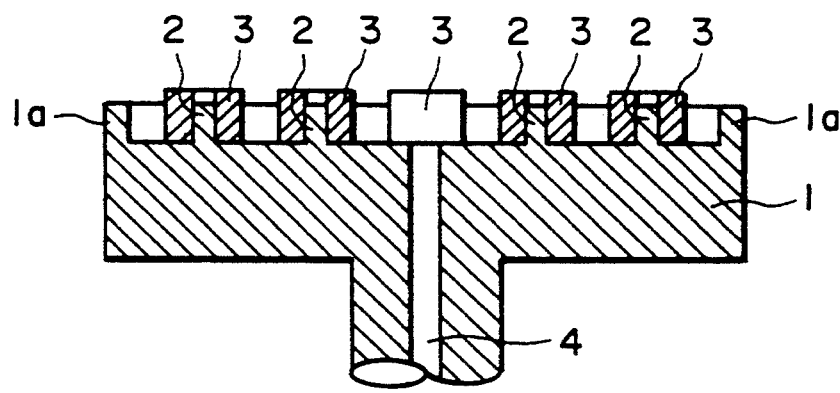
FIG. 2 is a sectional view taken on a line I—I in FIG. 1.

Embodiments of the present invention will now be explained in conjunction with the attached drawings.

Referring first to FIGS. 1–4, a first embodiment of the present invention will now be explained.

Wafer holding device of the vacuum attraction type according to this embodiment includes a main structural member 1 which is made of a rigid material such as stainless steel or ceramics, for example, having a large elasticity modulus, for correction of warp of a semiconductor wafer to be attracted thereto (see FIG. 3). The main structural member 1 has an outer circumferential wall 1a formed as a unit therewith. On the upper surface of the main structural member as encircled by the outer circumferential wall 1a, which surface is opposed to a wafer to be attracted, there are provided plural protrusions 2, numbering twelve in this example, each having a pin-like shape. These protrusions 2 have the same height (level) and are formed as a unit with the main structural member 1. Also, these protrusions are disposed with good symmetry.

Each projection 2 has an elastic member 3 which surrounds the associated projection. The elastic members 3 have the same height (level). The main structural member I has a vacuum port 4 formed therein for communicating the central portion of the upper surface of the main structural member with a vacuum source, not shown.

Each elastic member 3 is made of a material having an elasticity modulus smaller than that of the main structural member I and that of a wafer 5 to be attracted. Examples of usable material are: synthetic resin such as polypropylene, polyester, nylon, silicon rubber; synthetic rubber and the like. Further, a metal such as indium or the like which easily cause plastic deformation may be used, if within the range of elastic deformation.

As seen in FIG. 3, the elastic member 3 has a height $D+d$ (mm) which is higher than the height $D$ (mm) of the protrusion 2, by an amount $d$ (mm). In other words, the elastic member 3 projects beyond the top of the protrusion 2 by $d$ (mm). Each of the protrusion 2 and the elastic member 3 has a top surface (contact surface) having been finished to obtain a predetermined surface flatness, for the contact with an attracted wafer 5.

The wafer attracting operation will now be explained by reference to FIGS. 3 and 4.

Before start of a wafer attracting operation, a semiconductor wafer 5 to be attracted is conveyed by means of a conveying hand (not shown) to a position such as shown in FIG. 3 whereat the bottom face of the wafer 5 contacts the contact surface of the elastic member 3. After this, the vacuum port 4 is opened to the vacuum source (not shown) and the vacuum attraction to the bottom face of the wafer 5 starts. Here, if the ambience pressure (e.g. atmospheric pressure) at the upper face side of the wafer 5 is T (Torr), then the gas in the space enclosed by the main structural member 1, the outer circumferential wall 1a and the wafer 5 is evacuated by the vacuum source until the pressure in that space (i.e. attraction pressure) becomes equal to t (Torr) which is zero (0), for example. Thus, a pressure difference of $T-t$ (Torr) is produced between the top surface and the bottom surface of the wafer 5. As a result, if the wafer attraction area of the wafer holding device is Sw, then an attraction force of $$(T-t)/760 \times 10^5 \times Sw (Pa) \qquad (1)$$

is applied to the wafer 5.

On the other hand, as the wafer is attracted toward the upper surface of the main structural member 1 by means of this attraction force, the elastic member 3 is contracted by an amount corresponding to the quantity of displacement of the wafer 5. As a result, a repulsive force of the elastic member 3 is applied to the bottom surface of the wafer 5 in proportion to the displacement of the wafer. Therefore, when the wafer 5 is displaced by an amount corresponding to the difference $d$ (mm) (where $d>0$) between the height ($D+d$ (mm)) of the elastic member 3 and the height ($D$ (mm)) of the protrusion 2 and if the Young's modulus of the elastic member 3 is E (Pa) and the contact surface area between the wafer 5 and the elastic members 3 (total) is Se, then the repulsive force F to be applied to the wafer 5 is expressed as:

$$F = E \times d/(D+d) \times Se (Pa) \qquad (2)$$

It is seen therefrom that, in order to assure engagement of the bottom surface of the wafer 5 with the contact surface of the protrusion 2 against the repulsive force F, the level difference $d$ (mm) should satisfy a relation (3) such as follows:

$$E \times d/(D+d) \times Se < (T-t)/760 \times 10^5 \times Sw$$

On the other hand, in order to retain a space for allowing contraction of the elastic member 3, between the wafer attraction area Sw and the contact surface area Se, there should be a relation:

$$0 < d \leq (Sw - Se)/Se \times D \qquad (5)$$

It follows that, if $760 \cdot E \cdot Se(T-t) \cdot 10^5 \cdot Sw$, the relation (3) is rewritten into a relation (5), below, and therefore if the level difference $d$ is so set as to satisfy the relation (4) as well as the relation (5), the attracting operation can be performed without problem:

$$0 < d < [(T-t) \times 10^5]/760 \cdot E \cdot Se/Sw - (T-t) \times 10^5] \cdot D \qquad (5)$$

If on the other hand $760 \cdot E \cdot Se \leq (T-t) \times 10^5$, the attracting operation can be performed without a problem provided that the level difference $d$ is so set as to satisfy the relation (4).

After the attracting operation is completed in the manner described, the bottom face of the wafer 5 is vacuum attracted to and held by the wafer holding device, while being in contact to the contact surfaces of the protrusions 2 and the elastic members 3. Although the contact surface of each protrusion 2 has been finished, it may have small surface irregularity or waviness. Also, the bottom face of the wafer 5 may have small surface irregularity or waviness. Therefore, usually it is not possible to attain small contact heat resistance at the contact surface of the protrusion 2.

Since, however, each elastic member 3 is made of a material having an elasticity modulus smaller than that of the wafer 5, the contact surface thereof can easily deform in compliance with the surface irregularity or waviness of the bottom face of the wafer 5. As a result, the contact heat resistance at the contact surface of the elastic member can be made very small.

Accordingly, when in this state an exposure energy is applied to the wafer 5 for lithographic pattern transfer to the wafer, for semiconductor device manufacture, any heat applied to or produced in the wafer can be easily transmitted to the main structural member 1 and, therefore, degradation of the pattern transfer precision due to heat generation can be prevented effectively.

This has been confirmed by the inventors of the subject application. Namely, the inventors prepared a wafer holding device wherein its main structural member was made of stainless steel and its elastic members were made of silicon rubber. The height D of the main structural member 1 was 1 (mm), and the height $D+d$ of each elastic member 3 was 1.05 (mm), wherein the level difference $d=0.05$ (mm). After a wafer having a relatively good surface flatness was attracted, the contact heat resistance R1 was measured. The result is that:

$$R1 = 1 \times 10^{-3} (K.m^2/W)$$

Also, the contact heat resistance R2 of a comparative example device without any elastic member was measured. The result is that:

$$R2 = 1 \times 10^{-2} (K.m^2/W)$$

It is seen therefrom that, in accordance with the present embodiment, the contact heat resistance can be reduced to one-tenth (1/10) of that of the conventional wafer holding device and also that the temperature rise in the wafer can be reduced to one-tenth. As a result, the pattern transfer precision can be improved significantly.

While in the present embodiment each protrusion has a columnar pin-like shape as illustrated in FIG. 1, it is not limited to the disclosed form. Prismatic pin-like shape may be adopted, as an example.

Figure 5:
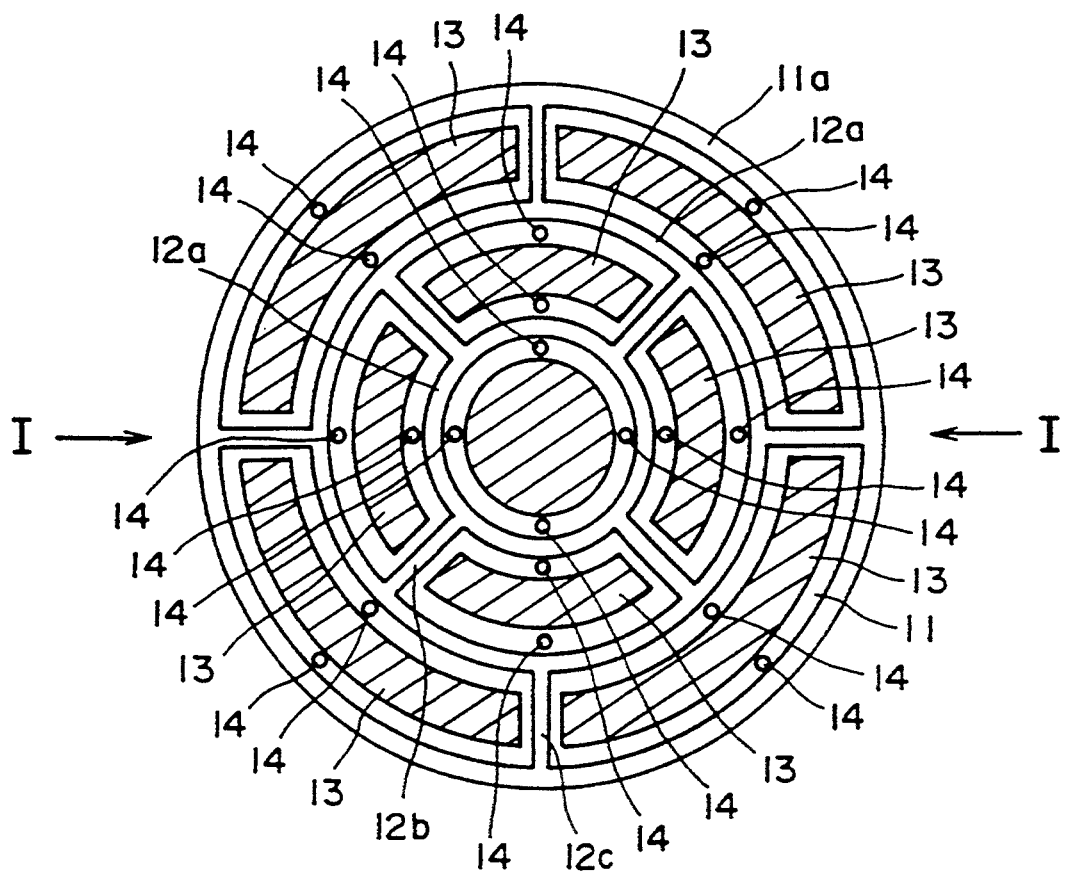
FIG. 5 is a top plan view of a wafer holding device of the vacuum attraction type according to a second embodiment of the present invention.
Figure 6:
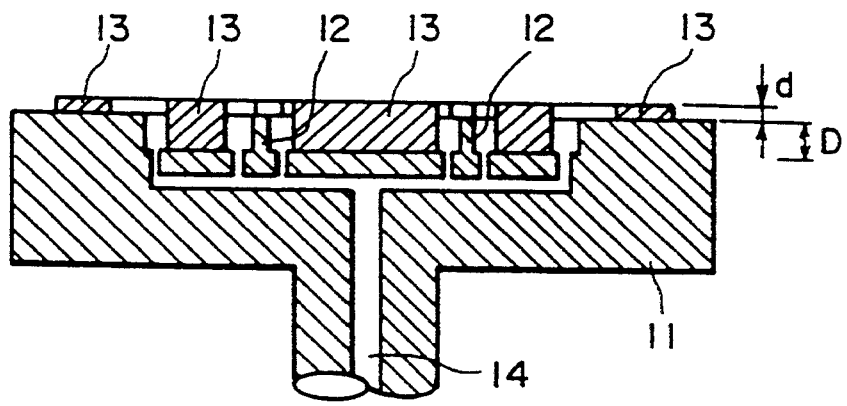
FIG. 6 is a sectional view taken on line I—I in FIG. 5.

FIGS. 5 and 6 show a wafer holding device of the vacuum attraction type according to a second embodiment of the present invention.

In this embodiment, two concentrically disposed ring-like protrusions 12a are formed on the upper surface of a main structural member 11 as a unit therewith, the upper surface being encircled by an outer circumferential wall 11a. The two protrusions 12a are connected to each other by four protrusions 12b which extend in directions inclined by 45 deg. as viewed in FIG. 5 with good symmetry. The outer ring-like protrusion 12a is connected to the outer circumferential wall 11b by four protrusions 12c which extend in longitudinal and transverse directions as viewed in FIG. 5 with good symmetry.

On the upper surface segments of the main structural member 11 as enclosed by the two ring-like projections 12a and the outer circumferential wall 11a, there are formed eight elastic members 13 each having a shape like a part of a ring. These elastic members 13 are disposed with good symmetry. Also, on the central portion of the upper surface of the main structural member 11, there is formed a circular elastic member 13. Further, the main structural member 11 has a number of vacuum ports 14 which are distributed in the upper surface of the main structural member with good symmetry.

In this embodiment, for allowing flatness correction of such a wafer as having a low surface flatness as compared with the wafer 5 as described with reference to the first embodiment, the level difference d is so set as to satisfy the following relation:

$$0 < d < [(T-t) \times 10^4]/[760.E.Se/Sw - (T-t) \times 10^4].D \quad (6)$$

This ensures tight engagement of the bottom face of the wafer with the protrusions 12.

It has been confirmed by experiments that, for a Si wafer having a flatness of 10 (micron) per 30 (mm) square, a thickness of 0.6 (mm) and a diameter of 150 (mm), the flatness correction can be performed with a differential pressure not less than 100 (Torr). Therefore, in order to ensure flatness correction through a differential pressure not less than 100 (Torr) and thus to assure abutment of the wafer 5 against the protrusions 12 through a force not less than 100 (Torr), the relation (3) as discussed is rewritten as follows:

$$E \times d/(D+d) \times Se + 100/760 \times 10^5 \times Sw < (T-t)/760 \times 10^5 \times Sw \quad (3')$$

Accordingly, in this case, the level difference d may be determined to satisfy a relation (7), below, which can be derived from rewriting the relation (3'):

$$0 < d < [(T-t-100) \times 10^5]/[760.E.Se/Sw - (T-t-100) \times 10^5].D \quad (7)$$

With this level difference, under a pressure difference not less than 100 (Torr), the bottom face of the wafer can be engaged with certainty to the contact surfaces of the protrusions 12a against the repulsive force F of the elastic members 13.

Generally, therefore, if sufficient flatness correction to a wafer is attainable with a differential pressure of T' (Torr), then in an ambience T>T' by setting the level difference d so as to satisfy the following relation:

$$0 < d < [(T-t-T') \times 10^5]/[760.E.Se/Sw - (T-t-T') \times 10^5].D \quad (8)$$

it is possible to assure tight engagement of the bottom face of the wafer with the contact surface of the protrusion 12 and satisfactory flatness correction of the wafer. It is to be noted here that it is not the second embodiment only, to which the relations (6)–(8) apply.

Also with the arrangement of the present embodiment, the contact heat resistance of the contact surface of the elastic member 13 with which an attracted wafer is to be held, can be made so small that enhanced pattern transfer precision is assured.

In the foregoing embodiments, the protrusions and the elastic members are disposed with good symmetry. However, they may be disposed asymmetrically. Since however a wafer usually has a circular shape, the symmetrical structure of elastic members can ensure better flatness precision of the wafer after it is attracted. Further, in the foregoing embodiment, each elastic member is formed integrally with an associated protrusion or protrusions, but it may be provided separately.

While the invention has been described with reference to the structures disclosed herein, it is not confined to the details set forth and this application is intended to cover such modifications or changes as may come within the purposes of the improvements or the scope of the following claims.

What is claimed is:

1. A wafer holding device, comprising:
   a structural member defining a wafer attraction plane and having protrusions for supporting a wafer to be exposed; and
   elastic members provided in associated with said protrusions and being made of a material having an elasticity modulus smaller than that of the wafer and that of said protrusions, said elastic members being distributed within an exposure field of the wafer attraction plane of said structural member, wherein
   the wafer attracted to said attraction plane is urged toward said protrusions to provide a flat wafer.

2. A device according to claim 1, wherein when the wafer is not attracted to said structural member, each elastic member projects beyond said protrusions.

3. A device according to claim 1, wherein said protrusions include a plurality of pins, and wherein each elastic member surrounds one of said pins.

4. A device according to claim 1, wherein said protrusions and said elastic members are disposed symmetrically on the wafer attraction plane.

5. A method of manufacturing semiconductor devices, comprising the steps of:

preparing a wafer holding device for holding a wafer to be exposed through vacuum attraction, the holding device including a structural member defining a wafer attraction plane and having protrusions, and elastic members distributed within an exposure field of the wafer attraction plane of the holding device, wherein each elastic member is made of a material having an elasticity modulus smaller than that of the protrusions;

placing the wafer on the wafer holding device so that it is held by the wafer holding device;

urging the wafer toward the protrusions in the wafer attraction plane to provide a flat wafer; and applying an exposure energy to the wafer held by the wafer holding device so that a pattern for manufacturing a semiconductor device is transferred to the wafer.

6. A method according to claim 5, wherein when the wafer is not attracted to the wafer holding device, the elastic member projects beyond the protrusions.

7. A method according to claim 5, further comprising placing a mask, having the pattern, with a proximity gap interposed between it and a wafer.

8. A wafer holding device for chucking a wafer through vacuum attraction, said device comprising:

a structural member having protrusions for supporting the wafer; and elastic members made of a material having an elasticity modulus smaller than that of the wafer and that of said protrusions, at least one of said elastic members being disposed within a field of said structural member corresponding to an exposure field of the wafer, wherein the wafer held through the vacuum attraction and supported by said protrusions causes deformation of said elastic members and is itself urged toward said protrusions to become flatter.

9. A wafer holding device for chucking a wafer through vacuum attractions, said device comprising:

a structural member having an outer circumferential wall and protrusions for supporting the wafer, said protrusions being distributed inside said outer circumferential wall; and elastic members made of a material having an elasticity modulus smaller than that of the wafer and that of said protrusions, said elastic members being distributed inside said outer circumferential wall, wherein the wafer held through the vacuum attraction and supported by said outer circumferential wall and said protrusions causes deformation of said elastic members.

* * * * *

UNITED STATES PATENT AND TRADEMARK OFFICE
CERTIFICATE OF CORRECTION

PATENT NO. : 5,374,829
DATED : December 20, 1994
INVENTOR(S) : Sakamoto et al.

It is certified that error appears in the above-indentified patent and that said Letters Patent is hereby corrected as shown below:

COLUMN 3:

Line 9, "member I" should read --member 1--.
Line 15, "member I" should read --member 1--.

COLUMN 4:

Line 20, "760.E.Se(T-t).$10^5$.Sw," should read --760·E·Se>(T-t)·$10^5$·Sw,--.

COLUMN 5:

Line 67, "Exd" should read --EXd--.

COLUMN 6:

Line 18, "$10^5$[.D" should read --$10^5$]·D--.
Line 51, "associated" should read --association--.

Signed and Sealed this

Twentieth Day of June, 1995

Attest:

BRUCE LEHMAN

Attesting Officer      Commissioner of Patents and Trademarks